(12) United States Patent
Zhang

(10) Patent No.: US 11,086,590 B2
(45) Date of Patent: Aug. 10, 2021

(54) METHOD AND SYSTEM FOR PROCESSING AUDIO SIGNALS

(71) Applicant: Lenovo (Beijing) Co., Ltd., Beijing (CN)

(72) Inventor: Guangjie Zhang, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 16/524,656

(22) Filed: Jul. 29, 2019

(65) Prior Publication Data

US 2020/0034110 A1  Jan. 30, 2020

(30) Foreign Application Priority Data

Jul. 27, 2018  (CN) .......................... 201810851142.7

(51) Int. Cl.
  *G06F 3/16* (2006.01)
  *G10L 25/63* (2013.01)
  *G10L 25/84* (2013.01)
  *G10L 25/90* (2013.01)

(52) U.S. Cl.
  CPC .............. *G06F 3/165* (2013.01); *G06F 3/167* (2013.01); *G10L 25/63* (2013.01); *G10L 25/84* (2013.01); *G10L 25/90* (2013.01)

(58) Field of Classification Search
  CPC ......... G06F 3/165; G06F 3/167; G10L 25/63; G10L 25/84; G10L 25/90; H03G 3/24; H03G 3/3005; H03G 3/20
  USPC ............................ 381/57, 104, 107, 109, 110
  See application file for complete search history.

(56) References Cited

U.S. PATENT DOCUMENTS

| | | | |
|---|---|---|---|
| 9,779,757 B1* | 10/2017 | Blanksteen | G06F 3/167 |
| 2005/0282590 A1* | 12/2005 | Haparnas | H04M 1/6016 |
| | | | 455/570 |
| 2011/0095875 A1* | 4/2011 | Thyssen | G09G 5/10 |
| | | | 340/407.1 |
| 2013/0058503 A1* | 3/2013 | Kato | H04R 3/04 |
| | | | 381/107 |
| 2014/0222432 A1* | 8/2014 | Ahn | G10L 15/22 |
| | | | 704/257 |

(Continued)

FOREIGN PATENT DOCUMENTS

| | | |
|---|---|---|
| CN | 105739942 A | 7/2016 |
| CN | 107122156 A | 9/2017 |

(Continued)

*Primary Examiner* — Jason R Kurr
(74) *Attorney, Agent, or Firm* — Anova Law Group, PLLC

(57) ABSTRACT

The present disclosure provides a method for processing audio signals. The method includes acquiring a first audio signal, the first audio signal including an adjustment instruction for adjusting a broadcast parameter of an electronic device; acquiring first scene information; determining a first amplitude corresponding to the first audio signal based on the first scene information and adjusting the broadcast parameter according to the first amplitude; and determining a second amplitude corresponding to a second audio signal and second scene information that is different from the first scene information. The method further includes adjusting the broadcast parameter of the electronic device according to the second amplitude, the second amplitude being different from the first amplitude, and the second audio signal including an adjustment instruction.

11 Claims, 7 Drawing Sheets

(56) References Cited

U.S. PATENT DOCUMENTS

| | | | |
|---|---|---|---|
| 2016/0253146 A1* | 9/2016 | Yang | H04N 21/4394 381/107 |
| 2017/0064244 A1* | 3/2017 | Abou Mahmoud | H04N 5/7605 |
| 2018/0084116 A1 | 3/2018 | Liu | |
| 2018/0097493 A1* | 4/2018 | Weksler | H04R 3/00 |
| 2019/0079721 A1* | 3/2019 | Vega | G06F 3/167 |
| 2019/0165750 A1* | 5/2019 | Goldman-Shenhar | H03G 3/20 |

FOREIGN PATENT DOCUMENTS

| | | |
|---|---|---|
| CN | 107360507 A | 11/2017 |
| CN | 107889028 A | 4/2018 |
| CN | 108040171 A | 5/2018 |

* cited by examiner

METHOD AND SYSTEM FOR PROCESSING AUDIO SIGNALS

CROSS-REFERENCE TO RELATED APPLICATION

This application claims priority to Chinese Patent Application No. 201810851142.7, entitled "Method for Processing Signals and Signal Processing System" filed on Jul. 27, 2018, the entire content of which is incorporated herein by reference.

TECHNICAL FIELD

The present disclosure relates to a method for processing signals and a signal processing system.

BACKGROUND

With the development of electronic technology, in order to facilitate the human-machine interaction, more and more electronic devices have integrated voice recognition service. As such, users may conveniently control the electronic devices through voice without relying on the physical control devices. For example, a user may adjust the broadcast volume when a mobile phone is playing a song by entering an audio signal such as "increase the volume" or "decrease the volume" to conveniently and quickly adjust the volume level without manually adjusting the volume adjustment button of the mobile phone.

Often, after the electronic device receives the audio signal input from the user, the electronic device performs the volume adjustment based on a predetermined fixed amplitude, which may be an inflexible method to adjust the volume for the user.

SUMMARY

One aspect of the present disclosure provides a method for processing audio signals. The method includes acquiring a first audio signal, the first audio signal including an adjustment instruction for adjusting a broadcast parameter of an electronic device; acquiring first scene information; determining a first amplitude corresponding to the first audio signal based on the first scene information and adjusting the broadcast parameter according to the first amplitude. The method further includes determining a second amplitude corresponding to a second audio signal and second scene information that is different from the first scene information, and adjusting the broadcast parameter of the electronic device according to the second amplitude, the second amplitude being different from the first amplitude, and the second audio signal including an adjustment instruction.

Another aspect of the present disclosure provides system for processing audio signals. The system includes a first acquisition module for acquiring a first audio signal, the first audio signal including an adjustment instruction for adjusting a broadcast parameter of an electronic device; a second acquisition module for acquiring first scene information; a third acquisition module for acquiring a first amplitude corresponding to the first audio signal based on the first scene information and adjusting the broadcast parameter of the electronic device according to the first amplitude; and a fourth acquisition module for acquiring a second amplitude corresponding to a second audio signal based on second scene information that is different from the first scene information and adjusting the broadcast parameter of the electronic device according to the second amplitude, the first amplitude being different from the second amplitude, and the second audio signal including an adjustment instruction.

Another aspect of the present disclosure provides a method for processing audio signals. The method includes receiving a first audio signal, the first audio signal including an adjustment instruction for adjusting a broadcast parameter of an electronic device; acquiring first scene information; determining a first amplitude corresponding to the first audio signal based on the first scene information and adjusting the broadcast parameter of the electronic device according to the first amplitude; receiving a second audio signal, the second audio signal including an adjustment instruction for adjusting a broadcast parameter of an electronic device. The method further includes acquiring a second scene information, the second scene information is different from the first scene information; and determining a second amplitude corresponding to the second audio signal based on the second scene information and adjusting the broadcast parameter of the electronic device according to the second amplitude, the second amplitude being different from the first amplitude.

BRIEF DESCRIPTION OF THE DRAWINGS

For a more complete understanding of the present disclosure and its advantages, reference is now made to the following descriptions taken in conjunction with the accompanying drawing, in which.

DETAILED DESCRIPTION OF THE EMBODIMENTS

Figure 1:
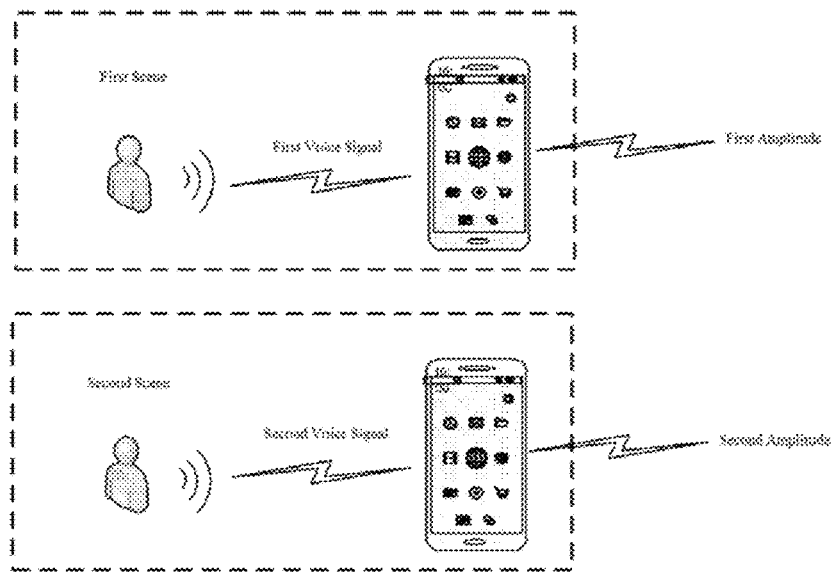
FIG. 1 is a schematic application scenario of a signal processing method and an signal processing system according to an embodiment of the present disclosure.

Hereinafter, embodiments of the present disclosure will be described with reference to the accompanying drawings. It should be understood that such description is exemplary only, and is not intended to limit the scope of the present disclosure. In the following detailed description, numerous specific details are set forth to provide a thorough understanding of the embodiments of the present disclosure. However, it should be apparent that one or more embodiments may be implemented without these specific details. In addition, descriptions of well-known structures and techniques are omitted in the following description to avoid unnecessarily obscuring the concepts of the present disclosure.

The terms used herein is for the purpose of describing particular embodiments only but is not intended to limit the present disclosure. The terms "comprising", "including", "containing" and the like as used herein indicate the presence of the features, steps, operations and/or components, but do not preclude the presence or addition of one or more other features, steps, operations or components.

All terms (including technical and scientific terms) used herein have the same meanings as commonly understood by the skilled in the art, unless defined otherwise. It should be noted that the terms used herein should be construed to have the same meanings as the context of the present specification and should not be interpreted in an idealized or overly stereotyped manner.

When describing an embodiment using the language of "at least one of A, B and C, etc.", it should be interpreted in accordance with the meaning of the expressions commonly understood by those skilled in the art (e.g., "a system having at least one of A, B and C" shall include but not limit to a system having A alone, B alone, C alone, A and B, A and C, B and C, and/or A, B and C, etc.). When describing an embodiment using the language of "at least one of A, B or C, etc.", it should be interpreted in accordance with the meaning of the expressions commonly understood by those skilled in the art (e.g., "a system having at least one of A, B and C" shall include but not limit to a system having A alone, B alone, C alone, A and B, A and C, B and C, and/or A, B and C, etc.). It should also be understood by those skilled in the art that essentially two or more optional items in transitional conjunctions and/or phrases in the description, claims, or accompanied drawings should be understood to include the possibility of one of these items, any one of these items, or both items. For example, the phrase "A or B" will be understood to include the possibility of "A" or "B" or "A and B".

Some block diagrams and/or flowcharts are shown in the accompanying drawings. It should be understood that some blocks or combinations thereof in the block diagrams and/or flowcharts may be implemented by computer program instructions. The computer program instructions may be provided to a general purpose computer, a dedicated computer, or processors of other programmable data processing devices, so that the instructions, when being executed by the processor, may create means for implementing the functions/operations as described in the block diagrams and/or flowcharts.

Thus, the techniques of the present disclosure may be implemented in forms of hardware and/or software (including firmware, microcode, etc.). In addition, the techniques of the present disclosure may be embodied in a form of a computer program product on a computer readable medium storing instructions. The computer program product may be used by an instruction execution system or in conjunction with an instruction execution system. In the context of the present disclosure, the computer readable medium may be any medium capable of containing, storing, transmitting, propagating, or transmitting instructions. For example, the computer readable media may include, but are not limited to, electrical, magnetic, optical, electromagnetic, infrared or semiconductor systems, apparatuses, devices, or propagation media. Particular examples of the computer readable media may include a magnetic storage device, such as a magnetic tape or a hard drive disk (HDD); an optical storage device, such as an optical disk (CD-ROM); a memory, such as a random access memory (RAM) or a flash memory; and/or a wired/wireless communication link.

The present disclosure provides a signal processing method. The method may include: acquiring a first audio signal, where the first audio signal may include an adjustment instruction for adjusting a broadcast parameter of an electronic device; acquiring first scene information; determining a first amplitude corresponding to the first audio signal based on at least the first scene information, and adjusting the broadcast parameter of the electronic device by using the first amplitude; and determining a second amplitude corresponding to a second audio signal based on second scene information that may be different from the first scene information, and adjusting the broadcast parameter of the electronic device by using the second amplitude. In particular, the first amplitude may be different from the second amplitude, and the second audio signal may include at least an adjustment instruction that may be the same as or similar to the first audio signal.

FIG. 1 is a schematic application scenario of a signal processing method and a signal processing system according to an embodiment of the present disclosure. It should be noted that FIG. 1 is merely an illustration of a scenario in which an embodiment of the present disclosure may be applied to help those skilled in the art to understand the technical content of the present disclosure, but it does not suggest that the embodiment of the present disclosure may not be used in other devices, systems, environments, or scenarios.

The signal processing method and the signal processing system provided in the embodiments of the present disclosure may be applied in any scenario where adjustment of the broadcast parameter of the electronic device may be needed. For example, it may be a scenario in which a family may need to turn down the volume of the electronic device while sleeping, a scenario in which the volume of the electronic device may need to be turned up in a noisy environment, a scenario in which a user may softly speak to lower the volume of the electronic device, or a scenario in which the user may be speaking very slowly to lower the volume of the electronic device, which is not limited herein. For the ease of understanding the technical solutions of the present disclosure, an application scenario shown in FIG. 1 is provided as an example. In this scenario, the user may need to adjust the broadcast volume of a mobile phone software.

In the first scene (e.g., a subway station), the user may input the first audio signal (e.g., increase the volume). In one embodiment, since the subway station may be a noisy environment, a relatively higher volume may be required to hear the sound clearly. As such, the first amplitude (e.g., 60% of the maximum volume) for adjusting the volume may be generated based on the first scene (the subway station). In the second scene (e.g., a restaurant), the user may input the second audio signal (e.g., slightly increase the volume), and the second amplitude (e.g., 40% of the maximum volume) may be generated based on the second scene (e.g., the restaurant). Since the first scene (e.g., the subway station) may be different from the second scene (e.g., the restaurant), the first amplitude (e.g., 60% of the maximum volume) that may be used to adjust the volume may be from the second amplitude (e.g., 40% of the maximum volume) based on the different environments.

Figure 2:
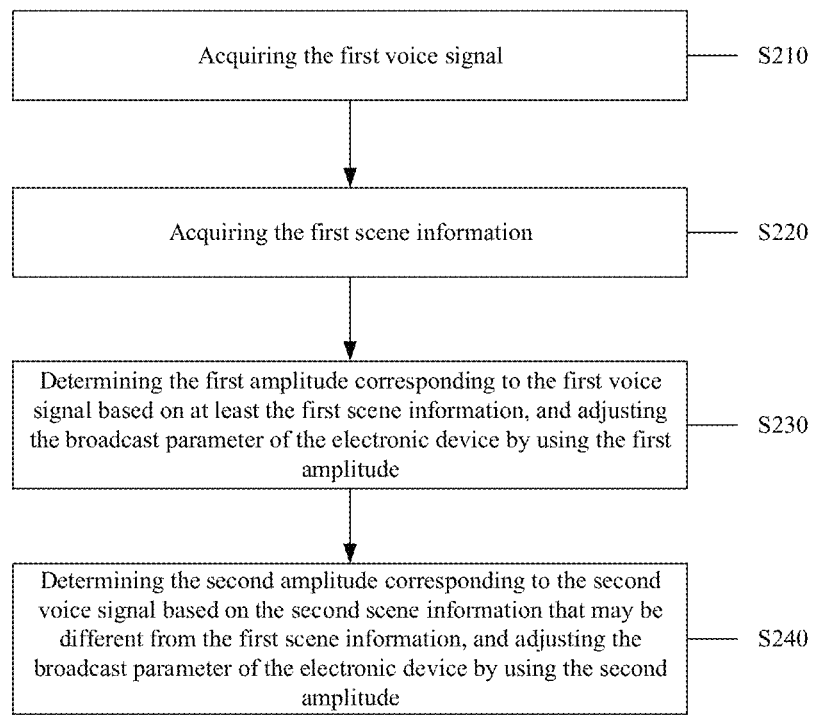
FIG. 2 is a schematic flowchart of a signal processing method according to an embodiment of the present disclosure.

FIG. 2 is a schematic flowchart of a signal processing method according to an embodiment of the present disclosure.

As shown in FIG. 2, the method may include operations S210-S240.

Operation S210, acquiring the first audio signal.

Operation S220, acquiring the first scene information.

Operation S230, determining the first amplitude corresponding to the first audio signal based on at least the first scene information, and adjusting the broadcast parameter of the electronic device by using the first amplitude.

Operation S240, determining the second amplitude corresponding to the second audio signal based on the second scene information that may be different from the first scene information, and adjusting the broadcast parameter of the electronic device by using the second amplitude.

In one embodiment, the audio signal may be an audio signal the user entered into the electronic device for instructing the adjustment of the broadcast parameter of the electronic device, such as "increase the volume", "lower the volume", etc. The broadcast parameter may be used to control the broadcast effects of the electronic device, and the instruction for adjusting the broadcast parameter of the electronic device are all within the scope of the present disclosure, which is not limited herein.

In one embodiment, the user may enter the audio signal in any scene. The embodiments of the present disclosure are described using the first scene and the second scene as an example, but it is not applicable only to two scenes, and it may include any number of scene based on the actual needs, which is not limited herein. In the first scene, the user may input the first audio signal, and in the second scene which may be different from the first scene, the user may input the second audio signal. In response to different scenes (e.g., the first scene and the second scene), different audio signals (e.g., the first audio signal and the second audio signal) may include the same or similar adjustment instructions, and may also include different adjustment instructions. As shown in FIG. 1, the present disclosure may be related to a method for a user to process the audio signals entered by the user in difference scenes, and different audio signals may include the same or similar adjustment instructions.

In one embodiment, by determining the first amplitude corresponding to the first audio signal based on at least the first scene information, the broadcast parameter of the electronic device may be adjusted by using the first amplitude. Further, by determining the second amplitude corresponding to the second audio signal based on the second scene information that may be different from the first scene information, and the broadcast parameter of the electronic device may be adjusted by using the second amplitude. Furthermore, the first amplitude may be different from the second amplitude. That is, the first amplitude may be greater than the second amplitude, or it may be less than the second amplitude. In one embodiment, the user may enter the same or similar audio signals into the electronic device for adjusting the broadcast parameter of the electronic device in different scenes, which may correspond to different adjustment amplitudes.

In one embodiment, the scene information may include, but is not limited to, environment information related to the electronic device, such as the current external environment of the electronic device when the user enters the voice information. The scene information may also include, but is not limited to, scene information related to the user, such as the user's voice volume, age, mood, pitch, speech rate, frequency, etc. The user may include, but is not limited to, a user entering the audio signal or an audience of the electronic device, such as the control of the broadcast of the speech rate, mood, and the like when broadcasting from Text-to-Speech (TTS), which is not limited herein.

More specifically, the adjustments and the differences of the adjustment amplitude of the broadcast parameter in different scenes will be described in detail below in conjunction with specific scene information, and will not be described here.

It should be noted that the adjustment instruction for increasing the volume may correspond to different voice information, such as the audio signal of "increase the volume" or "slightly increase the volume" mentioned in the embodiments of the present disclosure, as long as the audio signal includes an instruction to increase the volume, which is not limited herein.

For the sake of simplifying the description, the adjustment instruction in the following embodiments of the present disclosure is described by using the "increase the volume" instruction as an example. The adjustment method of other adjustment instructions may be deduced by analogy and will not be described again.

In the embodiments of the present disclosure, by entering the same or similar audio signals in different scenes that may correspond to different amplitudes for adjusting the broadcast effect parameter of the electronic device may not only improve the inflexibility of the fixed adjustment range in the conventional technology, which may lead to the use of multiple voice interactions between the user and the electronic device to reach a suitable adjustment effect, but may also facilitate the adjustment of the adjustment amplitude based on the actual situation. As such, the adjustment amplitude may be flexible, thereby reducing the number of voice interactions between the user and the electronic device and quickly reaching the technical effect of a suitable adjustment effect.

In conjunction with the specific embodiment, the signal processing method shown in FIG. 2 will be further described below with reference to FIG. 3A to FIG. 3F.

Figure 3A:
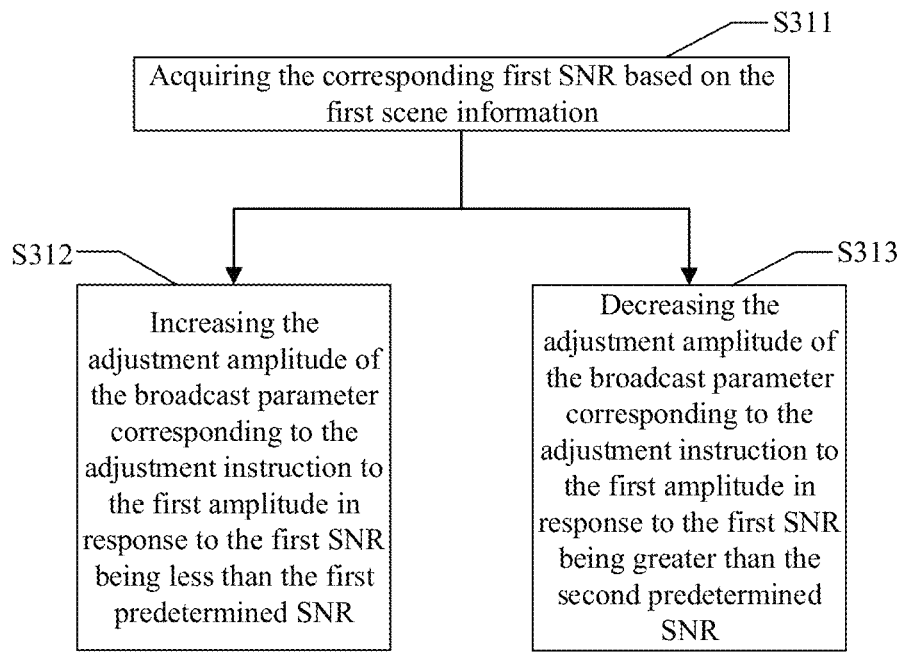
FIG. 3A is a schematic flowchart for obtaining a first amplitude that corresponds to a first audio signal based on at least first scene information according to an embodiment of the present disclosure.

FIG. 3A is a schematic flowchart for obtaining a first amplitude that corresponds to a first audio signal based on at least first scene information according to an embodiment of the present disclosure.

As shown in FIG. 3A, the method may include operations S311 and S312, or it may include operations S311 and S313.

Operation S311, acquiring a corresponding first Signal-to-Noise Ratio (SNR) based on the first scene information.

Operation S312, increasing the adjustment amplitude of the broadcast parameter corresponding to the adjustment instruction to the first amplitude in response to the first SNR being less than a first predetermined SNR.

Operation S313, decreasing the adjustment amplitude of the broadcast parameter corresponding to the adjustment instruction to the first amplitude in response to the first SNR being greater than a second predetermined SNR, where the first predetermined SNR may be greater or equal to the second predetermined SNR.

In one embodiment, the first audio signal may be analyzed to acquire the adjustment instruction corresponding to the first audio signal. If the second audio signal is "slightly increase the volume", then the corresponding adjustment instruction may be "increase the volume".

In one embodiment, the scene information may include environment information for indicating the environment in which the electronic device may be located. In order to realize the technical effect of quickly adjusting the broadcast effect of the electronic device based on the actual condition, a SNR range (e.g., between the first predetermined SNR and the second predetermined SNR, where the first predetermined SNR may be greater or equal to the second predetermined SNR) may be predetermined for the environment in which the electronic device may be located. As such, the adjustment of the broadcast parameter of the electronic device may be performed by using a predetermined amplitude or a default amplitude when the SNR is within the predetermined SNR range. When the SNR is outside the predetermined SNR range, the broadcast parameter of the electronic device may be adjusted without using the predetermined amplitude or the default amplitude. As such, the broadcast parameter of the electronic device may be adjusted based on the actual condition of the environment information of the environment in which the electronic device may be located, such as increase or decrease the adjustment amplitude. It should be noted that the SNR range may be determined based on the statistical analysis result of big data, or it may be manually specified, which is not limited herein.

It should be noted that considering the differences in the predetermined SNRs in the environment may not be significant, the predetermined SNR range may be the same in the first scene and the second scene. For the convenience of description, in the embodiment of the present disclosure, the first predetermined SNR may be 5 and the second predetermined SNR may be 10. It should be understood that this range is not a limitation on the predetermined SNR range, and different SNR ranges may be predetermined based on the actual conditions.

In one embodiment, the adjustment amplitude of the broadcast parameter corresponding to the adjustment instruction may be increased to the first amplitude in response to the first SNR being less than a first predetermined SNR. Further, the adjustment amplitude of the broadcast parameter corresponding to the adjustment instruction may be increased to the second amplitude in response to the a second SNR corresponding to the second scene being less than the first predetermined SNR, where the first amplitude may be different from the second amplitude. That is, the first amplitude may be greater than the second amplitude, or the first amplitude may be less than the second amplitude. More specifically, the magnitude of the first amplitude and the second amplitude may be determined based on the first SNR corresponding to the first scene and the second SNR corresponding to the second scene. Further, the magnitude of the first amplitude and the second amplitude may be determined based on the difference between the first SNR corresponding to the first scene and the first predetermined SNR and the difference between the first SNR corresponding to the second scene and the first predetermined SNR, which is not limited herein.

Figure 3B:
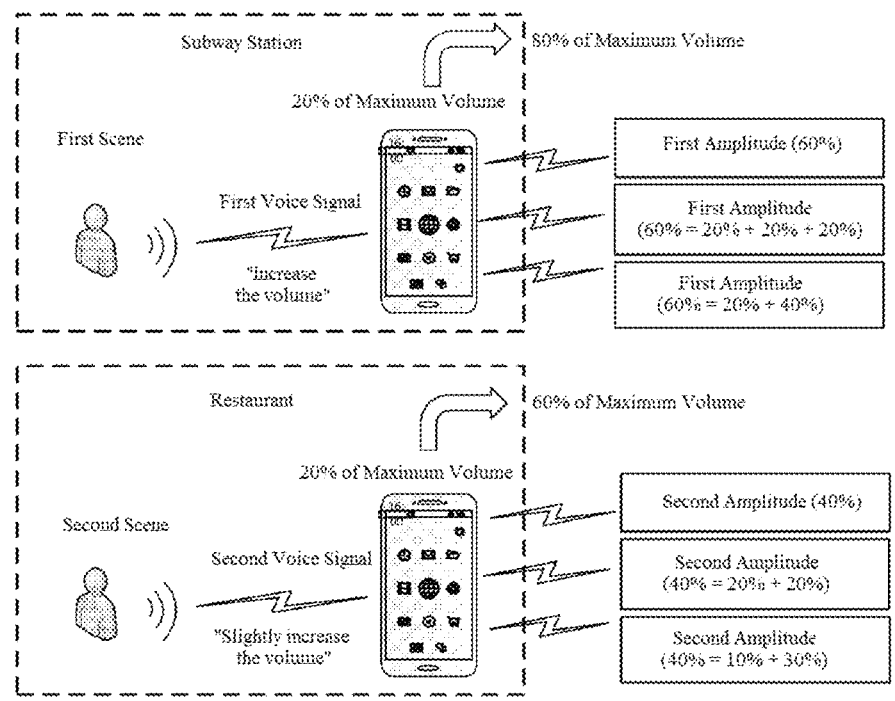
FIG. 3B is a schematic effect diagram for obtaining the first amplitude that corresponds to the first audio signal based on at least the first scene information according to an embodiment of the present disclosure.

FIG. 3B is a schematic effect diagram for obtaining the first amplitude that corresponds to the first audio signal based on at least the first scene information according to an embodiment of the present disclosure.

As shown in FIG. 3B, at present, the volume of the electronic device is at 20% of the maximum volume, the normal volume amplitude adjustment or the default amplitude adjustment may be fixed to 5%, the first predetermined SNR may be 5, and the second predetermined SNR may be 10. Further, the first SNR of the first scene may be 1, and the first SNR of the second scene may be 3.

It can be seen that the first SNR (e.g., 1) of the first scene (e.g., the subway station) and the first SNR (e.g., 3) of the second scene (e.g., the restaurant) are both lower than the first predetermined SNR (e.g., 5), which may indicate that the electronic device may be in a noisy or relatively noisy environment. Further, the SNR of the first scene (e.g., the subway station) is lower than the SNR or the second scene (e.g., the restaurant), which may indicate that the first scene (e.g., the subway station) may be more noisy than the second scene (e.g., the restaurant). As such, a higher volume may be needed in the first scene (e.g., the subway station) than the second scene (e.g., the restaurant) in order to hear clearly.

In the conventional technology, after receiving the adjustment instruction to increase the volume, the broadcast parameter of the electronic device may be adjusted at the normal amplitude or the default amplitude of 5% each time, and the adjustment amplitude may be fixed and unchangeable. As such, in the first scene (e.g., the subway station), the user and the electronic device may need to interact 12 times in order to adjust the volume from 20% of the maximum volume to a suitable volume, such as 80% of the maximum volume. In the second scene, the user and the electronic device may need to interact 8 times in order to adjust the volume from 20% of the maximum volume to a suitable volume, such as 60% of the maximum volume. Therefore, the adjustment amplitude may not be changed based on the environment in which the electronic device may be located, and the fixed adjustment amplitude may require multiple voice interactives with the electronic device, which may be time consuming and laborious, and the user experience may be poor.

According to an embodiment of the present disclosure, the volume may not be increased based on the fixed amplitude, such as the normal adjustment amplitude or the default adjustment amplitude of 5%. Instead, the adjustment amplitude of the broadcast parameter corresponding to the adjustment instruction may be directly increased to the first amplitude. In the first scene (e.g., the subway station), the normal amplitude or the default amplitude of 5% may be directly increased to the first amplitude of 60%. As such, the volume may be adjusted to a final volume of 80% of the maximum volume with one adjustment. In the second scene (e.g., the restaurant), the normal amplitude or the default amplitude of 5% may be directly increased to the first amplitude of 40%. As such, the volume may be adjusted to a final volume of 60% of the maximum volume with one adjustment. Therefore, based on the different first scene (e.g., the subway station) and the second scene (e.g., the restaurant), the technical effect of adjusting the volume from 20% to a suitable final volume with one adjustment may be realized by directly increasing the different adjustment amplitudes of the broadcast parameter corresponding to the adjustment instruction.

It should be noted that adjusting the broadcast parameter to the suitable size with one adjustment may be the most convenient and the quickest adjustment method. Of course, several adjustments may be made as long as it is less than the number of adjustments adjusted with the fixed amplitude in the conventional technology. For example, in the first scene (e.g., the subway station), the normal adjustment amplitude or the default adjustment amplitude of 5% may be increased to a first amplitude of 20%. As such, each adjustment may be 20%, and the volume may be adjusted to the final volume of 80% of the maximum volume after 3 adjustments. In the second scene (e.g., the restaurant), the normal adjustment amplitude or the default adjustment amplitude of 5% may be increased to a first amplitude of 20%. As such, each adjustment may be 20%, and the volume may be adjusted to the final volume of 60% of the maximum volume after 2 adjustments. Comparing to the fixed adjustment amplitude of 5% in the conventional technology, the number of adjustments may be reduced to certain extent, and the adjustment efficiency may be improved.

Of course, the amplitude of each adjustment may be the same or different, and it may be determined based on the actual situation, which is not limited herein. For example, in the first scene (e.g., the subway station), the normal adjustment amplitude or the default adjustment amplitude of 5% may be increased to a first amplitude of 20% and 40%. At first, 20% may be adjusted, then 40% may be adjusted. After 2 adjustments, the volume may be adjusted to the final volume of 80% of the maximum volume. In the second scene (e.g., the restaurant), the normal adjustment amplitude or the default adjustment amplitude of 5% may be increased to a first amplitude of 10% and 30%. At first, 10% may be adjusted, then 30% may be adjusted. After 2 adjustments, the volume may be adjusted to the final volume of 60% of the maximum volume. Comparing to the fixed adjustment amplitude of 5% in the conventional technology, the number of adjustments may be reduced to certain extent, and the adjustment efficiency may be improved.

Similarly, in one embodiment, the adjustment amplitude of the broadcast parameter corresponding to the adjustment instruction may be decreased to the first amplitude in response to the first SNR being greater than the second predetermined SNR. For example, if it is determined that the a family member is sleeping, the current environment may be relatively quiet, and the first SNR may be greater than the second predetermined SNR, then the adjustment amplitude may be decreased. For the specific adjustment method, reference may be made to the embodiment in which the first SNR may be less than the first predetermined SNR mentioned above, and details are not described herein again.

Through the embodiments of the present disclosure, the adjustment amplitude for different broadcast parameters may be conveniently generated based on the difference in the environment information of the environment in which the electronic device may be located. As such, the number of interactions between the user and the electronic device may be reduced, the efficiency of the parameter adjustment may be improved, and the user experience may be improved.

Figure 3C:
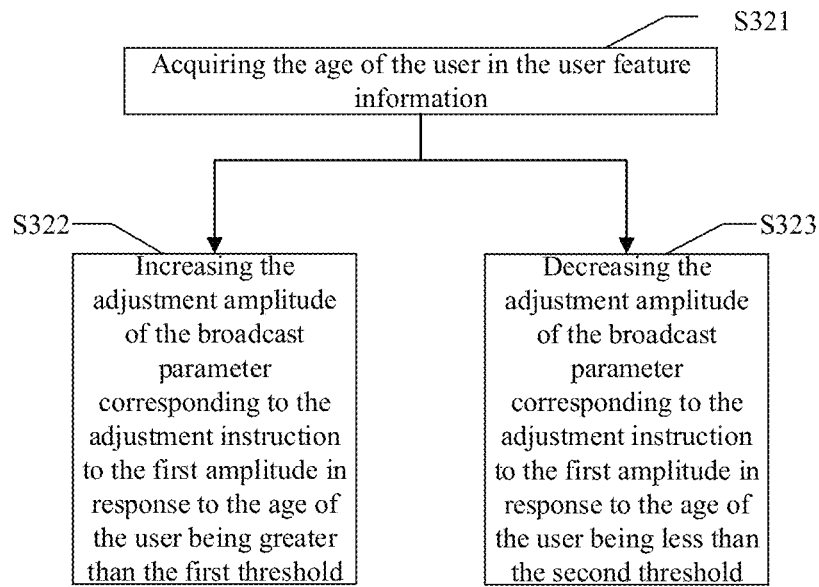
FIG. 3C is a schematic flowchart for obtaining the first amplitude that corresponds to the first audio signal based on at least the first scene information according to another embodiment of the present disclosure.

FIG. 3C is a schematic flowchart for obtaining the first amplitude that corresponds to first audio signal based on at least the first scene information according to another embodiment of the present disclosure.

As shown in FIG. 3C, the method may include operations S321 and S322, or it may include operations S321 and S323.

Operation S321, acquiring an age of the user in user feature information.

Operation S322, increasing the adjustment amplitude of the broadcast parameter corresponding to the adjustment instruction to the first amplitude in response to the age of the user being greater than a first threshold.

Operation S323, decreasing the adjustment amplitude of the broadcast parameter corresponding to the adjustment instruction to the first amplitude in response to the age of the user being less than a second threshold, where the first threshold may be greater than or equal to the second threshold.

In one embodiment, the scene information may also include user feature information for describing the audio signal entered, such as the age of the user. In order to realize the technical effect of quickly adjusting the broadcast effect of the electronic device based on the actual condition, an age range (e.g., between the first threshold and the second threshold, where the first threshold may be greater or equal to the second threshold) may be predetermined for the age of the who user may enter the audio signal. As such, the adjustment of the broadcast parameter of the electronic device may be performed by using a predetermined amplitude or a default amplitude when the age of the user is within the predetermined age range. When the age of the user is outside the predetermined age range, the broadcast parameter of the electronic device may be adjusted without using the predetermined amplitude or the default amplitude. As such, the broadcast parameter of the electronic device may be adjusted based on the age of the user entering the audio signal or the age of the audience of the electronic device, such as increase or decrease the adjustment amplitude. It should be noted that the age range may be determined based on the statistical analysis result of big data, or it may be manually specified, which is not limited herein.

In one embodiment, the adjustment amplitude of the broadcast parameter corresponding to the adjustment instruction may be increased to the first amplitude in response to the age of the user entering the audio signal or the age of the audience of the electronic device in the first scene being greater than the first threshold. Further, the adjustment amplitude of the broadcast parameter corresponding to the adjustment instruction may be increased to the second amplitude in response to the age of the user entering the audio signal or the age of the audience of the electronic device in the first scene being greater than the first threshold, where the first amplitude may be different from the second amplitude. That is, the first amplitude may be greater than the second amplitude, or the first amplitude may be less than the second amplitude. More specifically, the magnitude of the first amplitude and the second amplitude may be determined based on the age of the user entering the audio signal or the age of the audience of the electronic device in the first scene, and the age of the user entering the audio signal or the age of the audience of the electronic device in the second scene. Further, the magnitude of the first amplitude and the second amplitude may be determined based on the difference between the age of the user entering the audio signal or the age of the audience of the electronic device in the first scene and the first threshold and the difference between the age of the user entering the audio signal or the age of the audience of the electronic device in the second scene and the first threshold, which is not limited herein.

Figure 3D:
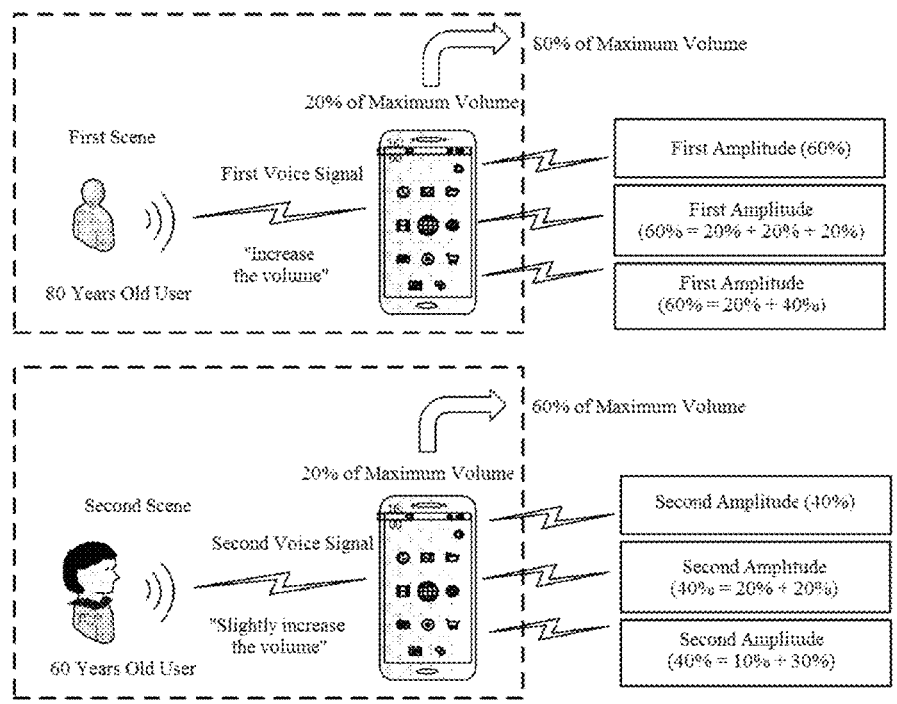
FIG. 3D is a schematic effect diagram for obtaining the first amplitude that corresponds to the first audio signal based on at least the first scene information according to another embodiment of the present disclosure.

FIG. 3D is a schematic effect diagram for obtaining the first amplitude that corresponds to the first audio signal based on at least the first scene information according to another embodiment of the present disclosure.

As shown in FIG. 3D, at present, the volume of the electronic device is at 20% of the maximum volume, the normal volume amplitude adjustment or the default amplitude adjustment may be fixed to 5%, the first threshold of the user age may be 50 years old, and the second threshold of the user age may be 25 years old. Further, the age of the user entering the audio signal in the first scene may be 80 years old, and the age of the user entering the audio signal in the second scene may be 60 years old.

It can be seen that the age (e.g., 80 years old) of the user entering the audio signal in the first scene and the age (e.g., 60 years old) of the user entering the audio signal in the second scene are both greater than the first threshold (e.g., 50 years old), which may indicate that the user may be older and the broadcast volume of the electronic device may need to be higher in order to hear clearly. In addition, the age (e.g., 80 years old) of the user entering the audio signal in the first scene is greater than the age (e.g., 60 years old) of the user entering the audio signal in the second scene, which may indicate that the first scene (the age of the user entering the audio signal may be 80 years old) may need a higher volume than the second scene (the age of the user entering the audio signal may be 60 years old) in order to hear clearly.

In the conventional technology, after receiving the adjustment instruction to increase the volume, the broadcast parameter of the electronic device may be adjusted at the normal amplitude or the default amplitude of 5% each time, and the adjustment amplitude may be fixed and unchangeable. As such, for an 80 years old user, the user and the electronic device may need to interact 12 times in order to adjust the volume from 20% of the maximum volume to a suitable volume, such as 80% of the maximum volume. For a 60 years old user, the user and the electronic device may need to interact 8 times in order to adjust the volume from 20% of the maximum volume to a suitable volume, such as 60% of the maximum volume. Therefore, the adjustment amplitude may not be changed based on the age of the user, and the fixed adjustment amplitude may require multiple voice interactives with the electronic device, which may be time consuming and laborious, and the user experience may be poor.

According to an embodiment of the present disclosure, the volume may not be increased based on the fixed amplitude, such as the normal adjustment amplitude or the default adjustment amplitude of 5%. Instead, the adjustment amplitude of the broadcast parameter corresponding to the adjustment instruction may be directly increased to the first amplitude. For an 80 years old user, the normal amplitude or the default amplitude of 5% may be directly increased to the first amplitude of 60%. As such, the volume may be adjusted to the final volume of 80% of the maximum volume with one adjustment. For a 60 years old user, the normal amplitude or the default amplitude of 5% may be directly increased to the first amplitude of 40%. As such, the volume may be adjusted to a final volume of 60% of the maximum volume with one adjustment. Therefore, based on the difference in the user feature information of the user entering the audio signal in different scenes, the technical effect of adjusting the volume from 20% to a suitable final volume with one adjustment may be realized by directly increasing the different adjustment amplitudes of the broadcast parameter corresponding to the adjustment instruction.

It should be noted that adjusting the broadcast parameter to the suitable size with one adjustment may be the most convenient and the quickest adjustment method. Of course, several adjustments may be made as long as it is less than the number of adjustments adjusted with the fixed amplitude in the conventional technology. For example, for an 80 years old user, the normal adjustment amplitude or the default adjustment amplitude of 5% may be increased to a first amplitude of 20%. As such, each adjustment may be 20%, and the volume may be adjusted to the final volume of 80% of the maximum volume after 3 adjustments. For a 60 years old user, the normal adjustment amplitude or the default adjustment amplitude of 5% may be increased to a first amplitude of 20%. As such, each adjustment may be 20%, and the volume may be adjusted to the final volume of 60% of the maximum volume after 2 adjustments. Comparing to the fixed adjustment amplitude of 5% in the conventional technology, the number of adjustments may be reduced to certain extent, and the adjustment efficiency may be improved.

Of course, the amplitude of each adjustment may be the same or different, and it may be determined based on the actual situation, which is not limited herein. For example, for an 80 years old user, the normal adjustment amplitude or the default adjustment amplitude of 5% may be increased to a first amplitude of 20% and 40%. At first, 20% may be adjusted, then 40% may be adjusted. After 2 adjustments, the volume may be adjusted to the final volume of 80% of the maximum volume. For a 60 years old user, the normal adjustment amplitude or the default adjustment amplitude of 5% may be increased to a first amplitude of 10% and 30%. At first, 10% may be adjusted, then 30% may be adjusted. After 2 adjustments, the volume may be adjusted to the final volume of 60% of the maximum volume. Comparing to the fixed adjustment amplitude of 5% in the conventional technology, the number of adjustments may be reduced to certain extent, and the adjustment efficiency may be improved.

Similarly, in one embodiment, the adjustment amplitude of the broadcast parameter corresponding to the adjustment instruction may be decreased as the first amplitude in response to the age of the user being less than the second threshold. For example, when the user is younger, the TTS broadcast speed may be slower for the ease of understanding. For the specific adjustment method, reference may be made to the embodiment in which the age of the user entering the voice may be greater than the first threshold mentioned above, and details are not described herein again.

Figure 3E:
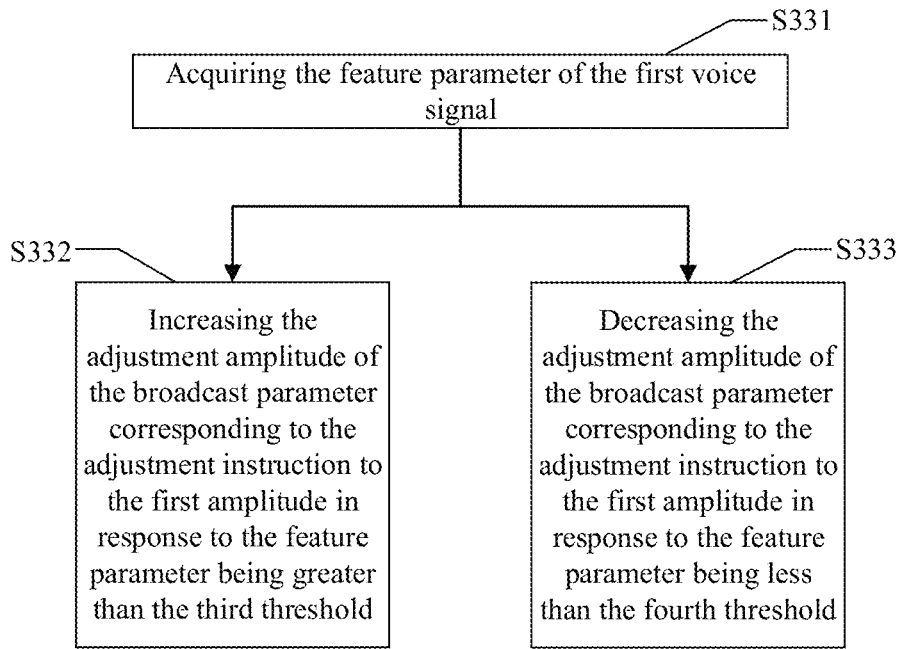
FIG. 3E is a schematic flowchart for obtaining the first amplitude that corresponds to the first audio signal based on at least the first scene information according to still another embodiment of the present disclosure.

FIG. 3E is a schematic flowchart for obtaining the first amplitude that corresponds to the first audio signal based on at least the first scene information according to still another embodiment of the present disclosure.

As shown in FIG. 3E, the method may include operations S331 and S332, or it may include operations S321 and S333.

Operation S331, acquiring a feature parameter of the first audio signal.

Operation S332, increasing the adjustment amplitude of the broadcast parameter corresponding to the adjustment instruction to the first amplitude in response to the feature parameter being greater than a third threshold.

Operation S333, decreasing the adjustment amplitude of the broadcast parameter corresponding to the adjustment instruction to the first amplitude in response to the feature parameter being less than a fourth threshold.

In one embodiment, the scene information may also include a feature parameter for indicating the audio signal, which may include, but is not limited to, the mood, pitch, frequency, speed, and the sound level of the user's voice. Taking the sound level of the user's voice as an example, in order to realize the technical effect of quickly adjusting the broadcast effect of the electronic device based on the actual condition, an sound level range (e.g., between the third threshold and the fourth threshold, where the third threshold may be greater or equal to the fourth threshold) may be predetermined for the sound level of the user entering the audio signal. As such, the adjustment of the broadcast parameter of the electronic device may be performed by using a predetermined amplitude or a default amplitude when the sound level of the user's voice is within the predetermined sound level range. When the sound level of the user's voice is outside the predetermined sound level range, the broadcast parameter of the electronic device may be adjusted based on the sound level of the audio signal, such as increase or decrease the adjustment amplitude. It should be noted that the range of the sound level may be determined based on the statistical analysis result of big data, or it may be manually specified, which is not limited herein.

In one embodiment, the adjustment amplitude of the broadcast parameter corresponding to the adjustment instruction may be increased to the first amplitude in response to the sound level of the user's voice in the first scene being greater than the third threshold. Further, the adjustment amplitude of the broadcast parameter corresponding to the adjustment instruction may be increased to the second amplitude in response to the sound level of the user's voice in the second scene being greater than the third threshold, where the first amplitude may be different from the second amplitude. That is, the first amplitude may be greater than the second amplitude, or the first amplitude may be less than the second amplitude. More specifically, the magnitude of the first amplitude and the second amplitude may be determined based on a sound level relationship between the sound level of the user's voice in the first scene and the sound level of the user's voice in the second scene. Further, the magnitude of the first amplitude and the second amplitude may be determined based on the difference between the sound level of the user's voice in the first scene and the third threshold and the difference between the sound level of the user's voice in the second scene and the third threshold, which is not limited herein.

Figure 3F:
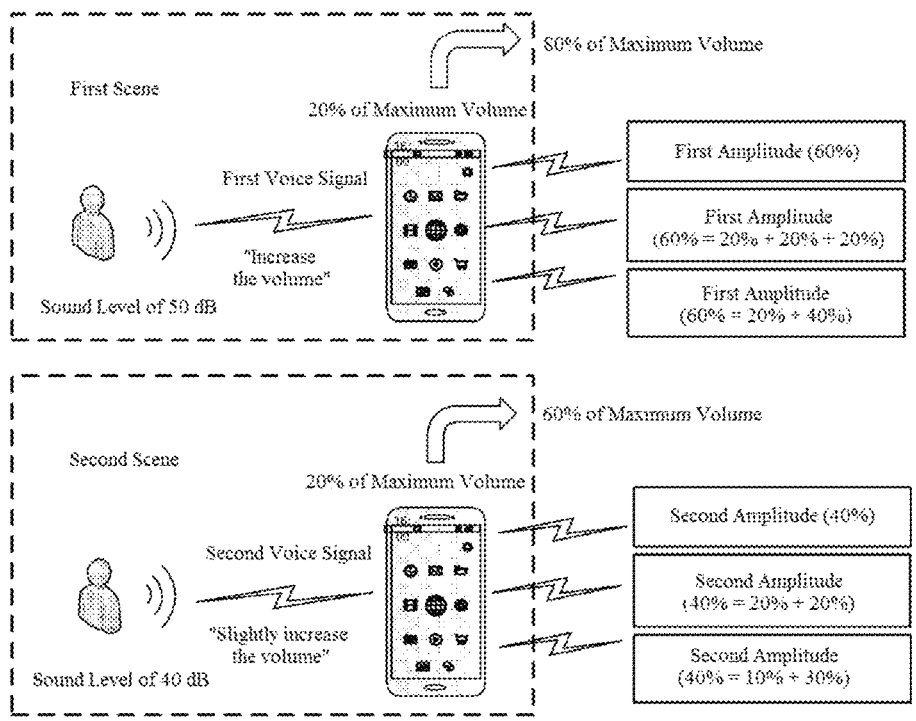
FIG. 3F is a schematic effect diagram for obtaining the first amplitude that corresponds to the first audio signal based on at least the first scene information according to still another embodiment of the present disclosure.

FIG. 3F is a schematic effect diagram for obtaining the first amplitude that corresponds to the first audio signal based on at least the first scene information according to still another embodiment of the present disclosure.

As shown in FIG. 3F, at present, the volume of the electronic device is at 20% of the maximum volume, the normal volume amplitude adjustment or the default amplitude adjustment may be fixed to 5%, the third threshold may be 30 dB, and the fourth threshold may be 15 dB. Further, the sound level of the user's voice in the first scene may be at 50 dB, and the sound level of the user's voice may be 40 at dB.

It can be seen that the sound level (e.g., 50 dB) of the user's voice in the first scene and the sound level of the user's voice in the second scene (e.g., 40 dB) are both greater than the third threshold (e.g., 30 dB), which may indicate that the user's voice may be relatively loud and the broadcast volume of the electronic device may need to be higher in order to hear clearly. In addition, the sound level (e.g., 50 dB) of the user's voice in the first scene is greater than the sound level of the user's voice in the second scene (e.g., 40 dB), which may indicate that adjustment amplitude of the first scene may be greater than the adjustment amplitude of the second scene.

In the conventional technology, after receiving the adjustment instruction to increase the volume, the broadcast parameter of the electronic device may be adjusted at the normal amplitude or the default amplitude of 5% each time, and the adjustment amplitude may be fixed and unchangeable. As such, in the first scene (e.g., the sound level of the user's voice may be at 50 dB), the user and the electronic device may need to interact 12 times in order to adjust the volume from 20% of the maximum volume to a suitable volume, such as 80% of the maximum volume. In the second scene (e.g., the sound level of the user's voice may be at 40 dB), the user and the electronic device may need to interact 8 times in order to adjust the volume from 20% of the maximum volume to a suitable volume, such as 60% of the maximum volume. Therefore, the adjustment amplitude may not be changed based on the environment in which the electronic device may be located, and the fixed adjustment amplitude may require multiple voice interactives with the electronic device, which may be time consuming and laborious, and the user experience may be poor.

According to an embodiment of the present disclosure, the volume may not be increased based on the fixed amplitude, such as the normal adjustment amplitude or the default adjustment amplitude of 5%. Instead, the adjustment amplitude of the broadcast parameter corresponding to the adjustment instruction may be directly increased to the first amplitude. In the first scene (e.g., the sound level of the user's voice may be at 50 dB), the normal amplitude or the default amplitude of 5% may be directly increased to the first amplitude of 60%. As such, the volume may be adjusted to the final volume of 80% of the maximum volume with one adjustment. In the second scene (e.g., the sound level of the user's voice may be at 40 dB), the normal amplitude or the default amplitude of 5% may be directly increased to the first amplitude of 40%. As such, the volume may be adjusted to a final volume of 60% of the maximum volume with one adjustment. Therefore, based on the difference in the sound level of the user's audio signal in different scenes, the technical effect of adjusting the volume from 20% to a suitable final volume with one adjustment may be realized by directly increasing the different adjustment amplitudes of the broadcast parameter corresponding to the adjustment instruction.

It should be noted that adjusting the broadcast parameter to the suitable size with one adjustment may be the most convenient and the quickest adjustment method. Of course, several adjustments may be made as long as it is less than the number of adjustments adjusted with the fixed amplitude in the conventional technology. For example, in the first scene (e.g., the sound level of the user's voice may be at 50 dB), the normal adjustment amplitude or the default adjustment amplitude of 5% may be increased to a first amplitude of 20%. As such, each adjustment may be 20%, and the volume may be adjusted to the final volume of 80% of the maximum volume after 3 adjustments. In the second scene (e.g., the sound level of the user's voice may be at 40 dB), the normal adjustment amplitude or the default adjustment amplitude of 5% may be increased to a first amplitude of 20%. As such, each adjustment may be 20%, and the volume may be adjusted to the final volume of 60% of the maximum volume after 2 adjustments. Comparing to the fixed adjustment amplitude of 5% in the conventional technology, the number of adjustments may be reduced to certain extent, and the adjustment efficiency may be improved.

Of course, the amplitude of each adjustment may be the same or different, and it may be determined based on the actual situation, which is not limited herein. For example, in the first scene (e.g., the sound level of the user's voice may be at 50 dB), the normal adjustment amplitude or the default adjustment amplitude of 5% may be increased to a first amplitude of 20% and 40%. At first, 20% may be adjusted, then 40% may be adjusted. After 2 adjustments, the volume may be adjusted to the final volume of 80% of the maximum volume. In the second scene (e.g., the sound level of the user's voice may be at 40 dB), the normal adjustment amplitude or the default adjustment amplitude of 5% may be increased to a first amplitude of 10% and 30%. At first, 10% may be adjusted, then 30% may be adjusted. After 2 adjustments, the volume may be adjusted to the final volume of 60% of the maximum volume. Comparing to the fixed adjustment amplitude of 5% in the conventional technology, the number of adjustments may be reduced to certain extent, and the adjustment efficiency may be improved.

Similarly, in one embodiment, the adjustment amplitude of the broadcast parameter corresponding to the adjustment instruction may be decreased to the first amplitude in response to the feature parameter being less than the fourth threshold. For the specific adjustment method, reference may be made to the embodiment in which the feature parameter may be greater than the third threshold mentioned above, and details are not described herein again.

It should be noted that when the feature parameter is a mood (e.g., excited, calm, impatient, or patient), a pitch (e.g., high or low), a frequency (e.g., high or low) and speed (e.g., fast or slow), different adjustment amplitude may be generated based on the different mood, pitch, frequency, or speed. For example, when the user enters the audio signal with a relatively excited emotion, a relatively high pitch, and a relatively high frequency in the first scene, the adjustment amplitude of the broadcast parameter corresponding to the adjustment instruction may be increased to the first amplitude. When the user enters the audio signal with a relatively more excited emotion, a relatively higher pitch, and a relatively higher frequency in the second scene, the adjustment amplitude of the broadcast parameter corresponding to the adjustment instruction may be increased to the second amplitude. In particular, the second amplitude may be greater than the first amplitude.

Conversely, when the user enters the audio signal with a relatively calm emotion, a relatively low pitch, and a relatively low frequency in the first scene, the adjustment amplitude of the broadcast parameter corresponding to the adjustment instruction may be decreased to the first amplitude. When the user enters the audio signal with a relatively calmer emotion, a relatively lower pitch, and a relatively lower frequency in the first scene, the adjustment amplitude of the broadcast parameter corresponding to the adjustment instruction may be decreased to the second amplitude. In particular, the second amplitude may be greater than the first amplitude.

The specific method for generating the adjustment amplitude may be performed based on the spirit of any of the methods described above. For example, reference may be made to the descriptions of the method for generating the amplitude based on the sound level of the voice, which is described herein again.

Through the embodiments of the present disclosure, the adjustment amplitude for different the broadcast parameters may be conveniently generated based on the feature parameter of the audio signal entered by the user in different scenes. As such, the number of interactions between the user and the electronic device may be reduced, the efficiency of the parameter adjustment may be improved, and the adjustment of the broadcast parameter may be more in line with the features of the audio signal entered by the user, thereby providing a better user experience.

In one embodiment, the broadcast parameter of the electronic device may include a broadcast speed and/or a broadcast volume.

Through the embodiments of the present disclosure, different adjustment amplitudes may be generated based on different environments, and the broadcast speed and/or the broadcast volume of the electronic device may be adjusted. As such, the user's broadcast needs may be met, such that the broadcast effect may meet the user's expectation, thereby enhancing the user experience.

It should be noted that the above description only described the technical solution for quickly adjusting the broadcast effect of the electronic device based on the actual situation when the scene information only includes a single feature, but it does not mean that the scene information may only include a single feature. Therefore, the scene information may include any one of the environment information for indicating the environment in which the electronic device may be located, the user feature information for describing the input audio signal, and the feature parameter for indicating the audio signal. Further, the first amplitude corresponding to the first audio signal may be obtained based on at least the first scene information, and a second amplitude corresponding to the second audio signal may also be obtained. For example, in the first scene, the current environment in which the electronic device may be located may be a noisy subway station, and the user entering the audio signal to increase the volume may be an elderly person that may be 60 years old. Correspondingly, the volume adjustment amplitude may be increased to bring the final volume to 90% of the maximum volume. Further, in the second scene, the current environment in which the electronic device may be located may be a noisy subway station, and the user entering the audio signal to slightly increase the volume may be an elderly person that may be 50 years old. Correspondingly, the volume adjustment amplitude may be increased to bring the final volume to 60% of the maximum volume. The method for generating the specific conditional amplitude may be appropriately expanded by referring to the method described above, and details are not described herein again.

Figure 4:
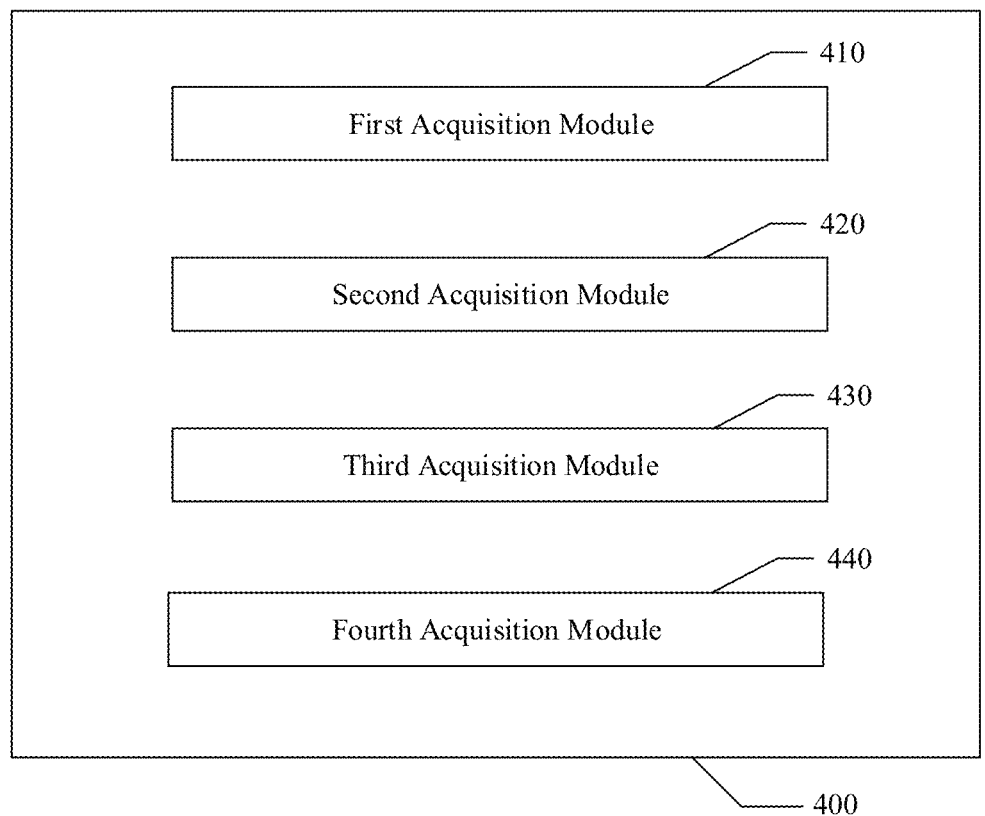
FIG. 4 is a schematic block diagram of a signal processing system according to another embodiment of the present disclosure.

FIG. 4 is a schematic block diagram of a signal processing system according to another embodiment of the present disclosure.

As shown in FIG. 4, a signal processing system 400 may include a first acquisition module 410, a second acquisition module 420, a third acquisition module 430, and a fourth acquisition module 440.

The first acquisition module 410 may be used to acquire the first audio signal, where the first audio signal may include the adjustment instruction for adjusting the broadcast parameter of the electronic device.

The second acquisition module 420 may be used to acquire the first scene information.

The third acquisition module 430 may be used to acquire the first amplitude corresponding to the first audio signal based on at least the first scene information, and adjust the broadcast parameter of the electronic device by using the first amplitude.

The fourth acquisition module 440 may be used to acquire the second amplitude corresponding to the second audio signal based on the second scene information that may be different from the first scene information, and adjust the broadcast parameter of the electronic device by using the second amplitude, where the first amplitude may be different from the second amplitude, and the second audio signal may include at least an adjustment instruction that may be the same or similar to the first audio signal.

In the embodiments of the present disclosure, by entering the same or similar audio signals in different scenes that may correspond to different amplitudes for adjusting the broadcast effect parameter of the electronic device may not only improve the inflexibility of the fixed adjustment range in the conventional technology, which may lead to the use of multiple voice interactions between the user and the electronic device to reach a suitable adjustment effect, but may also facilitate the adjustment of the adjustment range based on the scene. As such, the adjustment range may be flexible, thereby reducing the number of voice interactions between the user and the electronic device and quickly reaching the technical effect of a suitable adjustment effect.

Figure 5A:
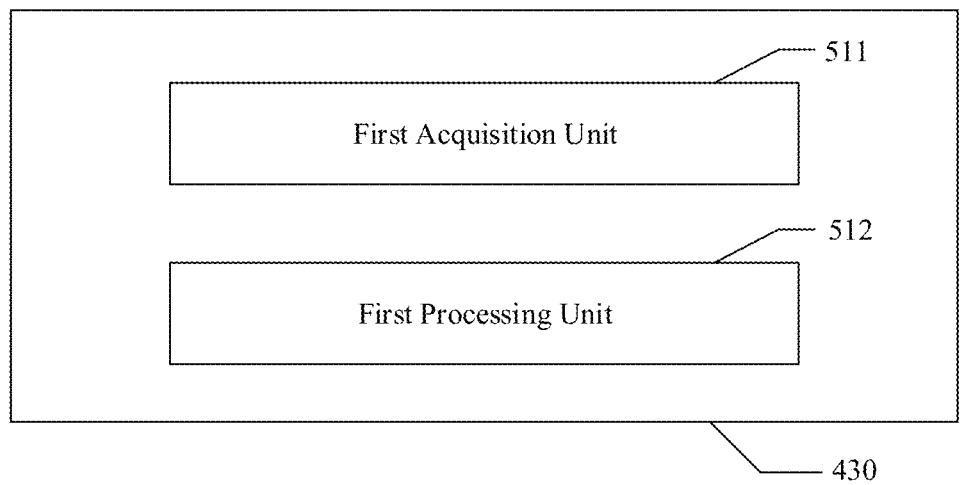
FIG. 5A is a schematic block diagram of a third acquisition module according to an embodiment of the present disclosure.

FIG. 5A is a schematic block diagram of a third acquisition module according to an embodiment of the present disclosure.

As shown in FIG. 5A, the third acquisition module 430 may further include a first acquisition unit 511 and a first processing unit 512

The first acquisition unit 511 may be used to acquire a corresponding first SNR based on the first scene information.

The first processing unit 512 may be used to increase the adjustment amplitude of the broadcast parameter corresponding to the adjustment instruction to the first amplitude in response to the first SNR being less than the first predetermined SNR; or, decrease the adjustment amplitude of the broadcast parameter corresponding to the adjustment instruction to the first amplitude in response to the first SNR being greater than the second predetermined SNR, where the first predetermined SNR may be greater than or equal to the second predetermined SNR.

Through the embodiments of the present disclosure, the adjustment amplitude for different broadcast parameters may be conveniently generated based on the different environment information in which the electronic device may be located. As such, the number of interactions between the user and the electronic device may be reduced, the efficiency of the parameter adjustment may be improved, and the user experience may be improved.

Figure 5B:
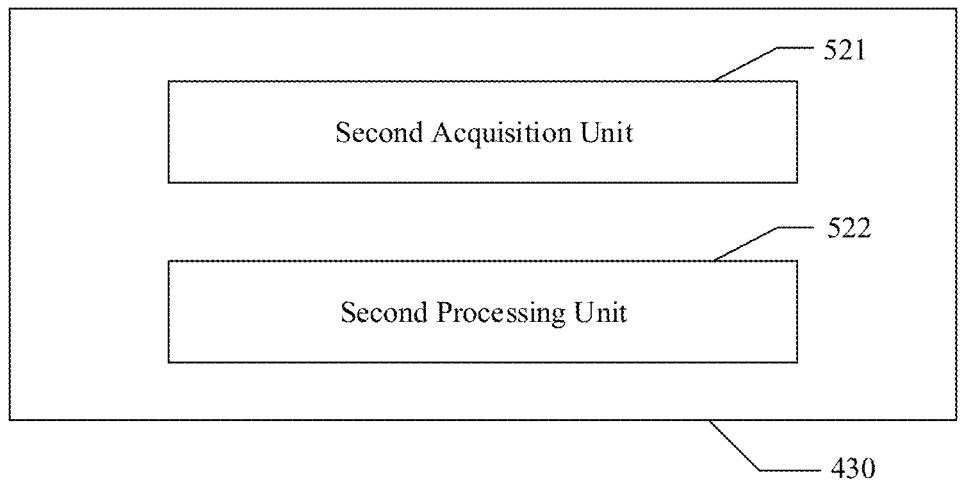
FIG. 5B is a schematic block diagram of a third acquisition module according to another embodiment of the present disclosure.

FIG. 5B is a schematic block diagram of a third acquisition module according to another embodiment of the present disclosure.

As shown in FIG. 5B, the third acquisition module 430 may further include a second acquisition unit 521 and a second processing unit 522.

The second acquisition unit 521 may be used to acquire the age of the user in the user feature information.

The second processing unit 522 may be used to increase the adjustment amplitude of the broadcast parameter corresponding to the adjustment instruction to the first amplitude in response to the age of the user being greater than the first threshold; or, decrease the adjustment amplitude of the broadcast parameter corresponding to the adjustment instruction to the first amplitude in response to the age of the user being less than the second threshold, where the first threshold may be greater than or equal to the second threshold.

Figure 5C:
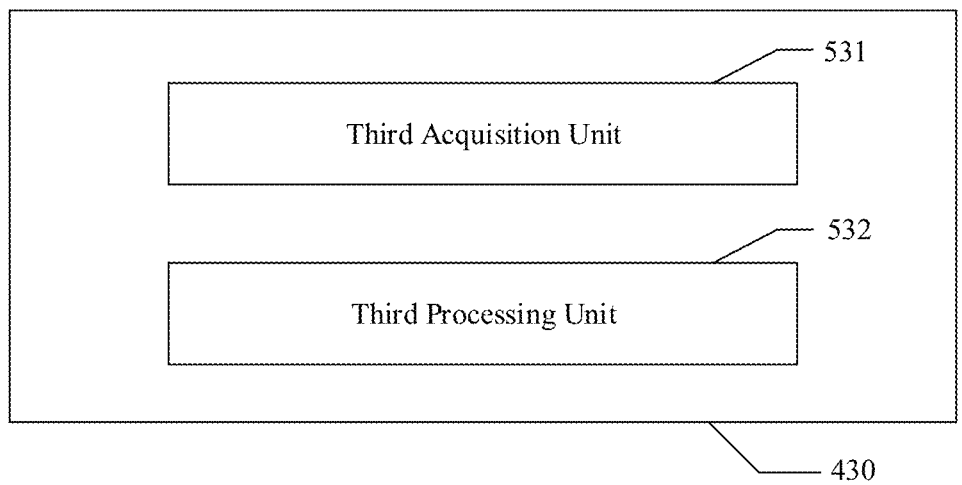
FIG. 5C is a schematic block diagram of a third acquisition module according to still another embodiment of the present disclosure.

FIG. 5C is a schematic block diagram of a third acquisition module according to still another embodiment of the present disclosure.

As shown in FIG. 5C, the third acquisition module 430 may further include a third acquisition unit 531 and a third processing unit 532.

The third acquisition unit 531 may be used to acquire the feature parameter of the first audio signal.

The third processing unit 532 may be used to increase the adjustment amplitude of the broadcast parameter corresponding to the adjustment instruction to the first amplitude in response to the feature parameter being greater than the third threshold; or, decrease the adjustment amplitude of the broadcast parameter corresponding to the adjustment instruction to the first amplitude in response to the feature parameter being less than the fourth threshold.

Through the embodiments of the present disclosure, the adjustment amplitude for different the broadcast parameters may be conveniently generated based on the feature parameter of the audio signal entered by the user in different scenes. As such, the number of interactions between the user and the electronic device may be reduced, the efficiency of the parameter adjustment may be improved, and the adjustment of the broadcast parameter may be more in line with the features of the audio signal entered by the user, thereby providing a better user experience.

In one embodiment, the broadcast parameter of the electronic device may include a broadcast speed and/or a broadcast volume.

Through the embodiments of the present disclosure, different adjustment amplitudes may be generated based on different environments, and the broadcast speed and/or the broadcast volume of the electronic device may be adjusted. As such, the user's broadcast needs may be met, such that the broadcast effect may meet the user's expectation, thereby enhancing the user experience.

In some embodiment, at least some functionalities of any one or more of the modules, units, and subunits of the present disclosure may be implemented in one module. In some other embodiments, any one or more of the modules, units, and subunits of the present disclosure may be split into multiple modules. In some embodiments, any one or more of the modules, units, and subunits of the present disclosure may be at least partially implemented as a hardware circuit. For example, the hard ware circuit can be a field programmable gate array (FPGA), a programmable logic array (PLA), a system-on-chip, a system-on-substrate, a system-on-package and an application specific integrated circuit (ASIC), etc. In some other embodiments, the modules, units, and subunits of the present disclosure may be implemented in any other reasonable manner that integrates or encapsulates the circuit using hardware or firmware. In some other embodiments, one or more of the modules, units, and subunits of the present disclosure may be implemented in an appropriate combination of three forms of software, hardware, and firmware. Alternatively, one or more of the modules, units, and subunits of the present disclosure may be at least partially implemented as a computer program module, and when the computer program module is executed by a computer, the corresponding functions may be performed.

For example, any of the first acquisition module 410, the second acquisition module 420, the third acquisition module 430, and the fourth acquisition module 440 may be combined into one module, or any of modules mentioned above may be split into multiple modules. Alternatively, at least some functionalities of one or more of these modules may be combined with at least some functionalities of the other modules and implemented in a single module. In some embodiments, one or more of the first acquisition module 410, the second acquisition module 420, the third acquisition module 430, and the fourth acquisition module 440 may be at least partially implemented as a hardware circuit. For example, the hard ware circuit can be a field programmable gate array (FPGA), a programmable logic array (PLA), a system-on-chip, a system-on-substrate, a system-on-package and an application specific integrated circuit (ASIC), etc. In some other embodiments, one or more of the above modules may be implemented in any other reasonable manner that integrates or encapsulates the circuit using hardware or firmware. In some other embodiments, one or more of the above modules may be implemented in an appropriate combination of three forms of software, hardware, and firmware. Alternatively, one or more of the first acquisition module 410, the second acquisition module 420, the third acquisition module 430, and the fourth acquisition module 440 may be at least partially implemented as a computer program module, and when the computer program module is executed by a computer, the corresponding functions may be performed.

Figure 6:
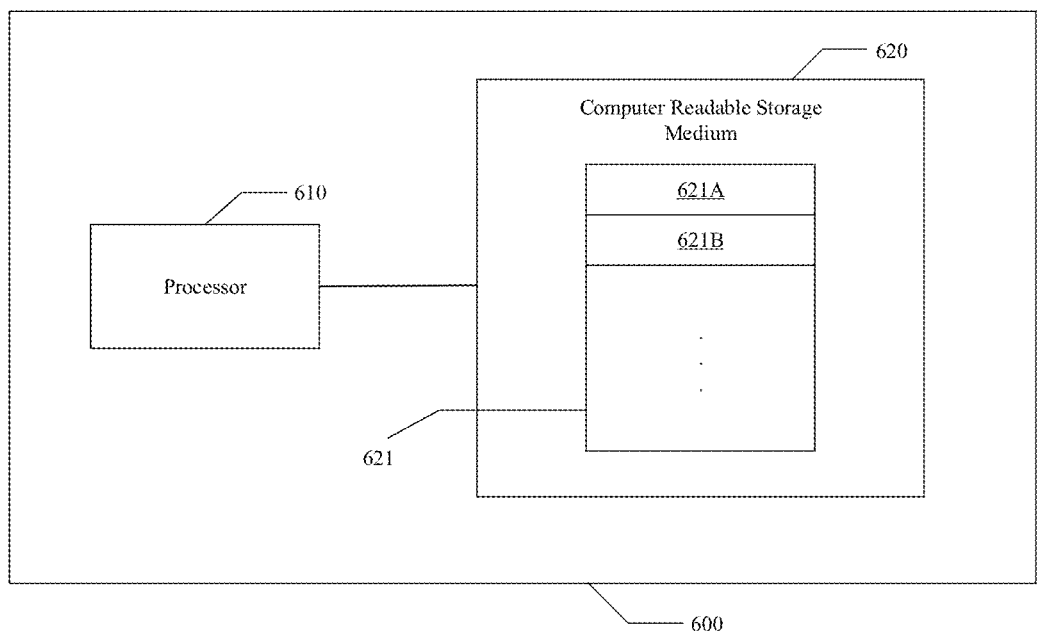
FIG. 6 is a schematic block diagram of a computer system according to an embodiment of the present disclosure.

FIG. 6 is a schematic block diagram of a computer system according to an embodiment of the present disclosure. The computer system shown in FIG. 6 is merely for illustrative purpose and should not impose any limitation on the function and scope of use of the embodiments of the present disclosure.

As shown in FIG. 6, the computer system 600 may include a processor 610 and a computer readable storage medium 620. The computer system 600 may be used to perform the method provided in the embodiments of the present disclosure.

More specifically, the processor 610 may include, for example, general purpose microprocessors, instruction set processors and/or associated chips sets and/or special purpose microprocessors (e.g., application specific integrated circuits (ASICs)), and the like. The processor 610 may also include an on-board memory for cache usage. The processor 610 may be a single processing unit or a plurality of processing units for performing different actions of the method according to the embodiments of the present disclosure.

The computer-readable storage medium 620 may be any medium that can contain, store, communicate, propagate, or transport instructions. For example, readable storage medium may include but are not limited to electrical, magnetic, optical, electromagnetic, infrared, or semiconductor systems, apparatus, devices, or propagation medium. Specific examples of readable storage medium include a magnetic storage device such as a magnetic tape or a hard disk (HDD), an optical storage device such as a compact disc (CD-ROM), a memory such as a random access memory (RAM) or a flash memory, and/or a wired/wireless communication link.

The computer readable storage medium 620 may include a computer program 621. The computer program 621 may include codes/computer executable instructions that, when executed by the processor 610, may cause the processor 610 to perform the method provided in the embodiments of the present disclosure or any variation thereof.

The Computer program 621 may be configured to be computer program codes, including, for example, computer program modules. For example, in one embodiment, the codes in the computer program 621 may include one or more program modules including, for example, a module 621A, a module 621B, etc. It should be noted that the division manner and the number of modules are not fixed, and those skilled in the art may use appropriate program modules or combination of program modules according to actual situations. When these program module combinations are executed by the processor 610, the processor 610 may perform the method described in the embodiments of the present disclosure or any variations thereof.

In one embodiment, at least one of the first acquisition module 410, the second acquisition module 420, the third acquisition module 430, and the fourth acquisition module 440 may be implemented as a computer program module described with reference to FIG. 6, which, when executed by the processor 610, may implement the corresponding operations described above.

The present disclosure further provides a computer readable storage medium. The computer readable storage medium may be included in the device, apparatus, or system in the above described embodiments, or a stand-alone computer readable storage medium not included in the device, apparatus, or system. The computer readable storage medium may store one or more programs. When one or more of the above programs are executed, the method provided in the embodiments of the present disclosure may be implemented.

In accordance with the embodiments of the present disclosure, a computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

In the embodiments of the present disclosure, a computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood by those skilled in the art that the features described in the respective embodiments and/or claims of the present disclosure may be combined in various ways, even if such combinations are not explicitly described in the present disclosure. In particular, without departing from the spirit and teaching of the present disclosure, the features described in the respective embodiments and/or claims can be combined in various ways. All of these combinations fall within the scope of the present disclosure.

While the present disclosure has been shown and described with reference to various embodiments thereof, it will be understood by those skilled in the art that various modifications in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

What is claimed is:

1. A method for processing signals, comprising:
   acquiring a first audio signal, the first audio signal including an adjustment instruction for adjusting a broadcast parameter of an electronic device and acquiring an age of a user according to user feature information, the broadcast parameter includes various speeds and various amplitudes of broadcasting;
   acquiring first surrounding scene information including at least surrounding noises;
   determining at least one of a first amplitude and a first speed of broadcasting corresponding to the first audio signal based on the first surrounding scene information and adjusting the broadcast parameter according to the first amplitude;
   determining at least one of a second amplitude and a second speed of broadcasting corresponding to a second audio signal and second surrounding scene information that is different from the first surrounding scene information, and adjusting the broadcast parameter of the electronic device according to the second amplitude or the second speed, the second amplitude or the second speed being different from the first amplitude and the first speed respectively, and the second audio signal including an adjustment instruction; and
   in response to the age of the user being greater than a first threshold or less than a second threshold, increasing or decreasing an adjustment amplitude or speed to the first amplitude, the first speed, the second amplitude or the second speed of broadcasting correspondingly.

2. The method of claim 1, wherein the first surrounding scene information includes a corresponding first signal-to-noise ratio based on the first surrounding scene information; and
   increasing the adjustment amplitude to the first amplitude and/or decreasing an adjustment speed to the first speed corresponding to the first audio signal based on the first surrounding scene information in response to the first signal-to-noise ratio being smaller than a first signal-to-noise ratio threshold; or
   decreasing the adjustment amplitude to the first amplitude and/or increasing an adjustment speed to the first speed corresponding to the first audio signal based on the first surrounding scene information in response to the first signal-to-noise ratio being greater than a second signal-to-noise ratio, the first signal-to-noise ratio being greater than or equal to the second signal-to-noise ratio.

3. The method of claim 1, wherein the first surrounding scene information also includes a feature parameter, and the method further includes:
   acquiring the feature parameter of the first audio signal; and
   increasing the adjustment amplitude to the first amplitude and/or decreasing the adjustment speed to the first speed corresponding to the first audio signal based on the first surrounding scene information in response to the feature parameter being greater than a third threshold; or
   decreasing the adjustment amplitude to the first amplitude and/or increasing the adjustment speed to the first speed corresponding to the first audio signal based on the first surrounding scene information in response to the feature parameter being smaller than a fourth threshold, the feature parameter including one of the following:
   a volume parameter of the audio signal;
   a pitch parameter of the audio signal;
   a mood parameter of the audio signal; or
   a speed parameter of the audio signal.

4. A signal processing system, comprising:
   a first acquisition module for acquiring a first audio signal, the first audio signal including an adjustment instruction for adjusting a broadcast parameter including various speeds and various amplitudes of broadcasting of an electronic device;
   a second acquisition module for acquiring first surrounding scene information which includes at least surrounding noises;
   a third acquisition module for acquiring a first amplitude and a first speed corresponding to the first audio signal based on the first surrounding scene information and adjusting the broadcast parameter of the electronic device according to the first amplitude and the first speed, wherein the third acquisition module comprising a second acquisition unit for acquiring an age of a user according to user feature information; and
   a fourth acquisition module for acquiring a second amplitude and a second speed corresponding to a second audio signal based on second surrounding scene information that is different from the first surrounding scene information and adjusting the broadcast parameter of the electronic device according to the second amplitude and the second speed, the first amplitude and the first speed being different from the second amplitude and the second speed, and the second audio signal including an adjustment instruction;
   and
   wherein in response to the age of the user being greater than a first threshold or less than a second threshold, the second processing unit is configured to increase or decrease an adjustment amplitude to the first amplitude and the second amplitude and/or an adjustment speed to the first and the second speed correspondingly.

5. The system of claim 4, wherein the third acquisition module includes:
   a first acquisition unit for acquiring a corresponding first signal-to-noise ratio based on the first surrounding scene information; and
   a first processing unit for increasing the adjustment amplitude to the first amplitude and/or decreasing the adjustment speed to the first speed corresponding to the first audio signal based on the first surrounding scene information in response to the first signal-to-noise ratio being smaller than a first signal-to-noise ratio threshold; or decreasing the adjustment amplitude to the first amplitude and/or increasing the adjustment speed to the first speed corresponding to the first audio signal based on the first surrounding scene information in response to the first signal-to-noise ratio being greater than a second signal-to-noise ratio, the first signal-to-noise ratio is greater than or equal to the second signal-to-noise ratio.

6. The system of claim 4, wherein the third acquisition module includes:

a third acquisition unit for acquiring a feature parameter of the first audio signal; and a third processing unit for increasing the adjustment amplitude to the first amplitude and/or decreasing the adjustment speed to the first speed corresponding to the first audio signal based on the first surrounding scene information in response to the feature parameter being greater than a third threshold; or decreasing the adjustment amplitude to the first amplitude and/or decreasing the adjustment speed to the first speed corresponding to the first audio signal based on the first surrounding scene information in response to the feature parameter being smaller than a fourth threshold, the feature parameter including one of the following:

a volume parameter of the audio signal;

a pitch parameter of the audio signal;

a mood parameter of the audio signal; or a speed parameter of the audio signal.

7. A signal processing method, comprising:

receiving a first audio signal, the first audio signal including an adjustment instruction for adjusting a broadcast parameter of an electronic device, the broadcast parameter including various speeds and various amplitudes of broadcasting;

acquiring first surrounding scene information including at least surrounding noises and acquiring an age of a user according to user feature information;

determining at least one of a first amplitude and a first speed corresponding to the first audio signal based on the first surrounding scene information and adjusting the broadcast parameter of the electronic device according to the first amplitude;

receiving a second audio signal, the second audio signal including an adjustment instruction for adjusting the broadcast parameter of the electronic device;

acquiring a second surrounding scene information, the second surrounding scene information being different from the first surrounding scene information;

determining at least one of a second amplitude and a second speed of broadcasting corresponding to the second audio signal based on the second surrounding scene information and adjusting the broadcast parameter of the electronic device according to the second amplitude and the second speed; and in response to the age of the user being greater than a first threshold or less than a second threshold, increasing or decreasing an adjustment amplitude to the first amplitude, the first speed, the second amplitude, or the second speed of the broadcasting correspondingly.

8. The method of claim 7, further comprising:

acquiring a corresponding first signal-to-noise ratio based on the first surrounding scene information; and increasing the adjustment amplitude to the first amplitude and/or decreasing an adjustment speed to the first speed corresponding to the first audio signal based on the first surrounding scene information in response to the first signal-to-noise ratio being smaller than a first signal-to-noise ratio threshold; or decreasing the adjustment amplitude to the first amplitude and/or increasing an adjustment speed to the first speed corresponding to the first audio signal based on the first surrounding scene information in response to the first signal-to-noise ratio being greater than a second signal-to-noise ratio, wherein the first signal-to-noise ratio is greater than or equal to the second signal-to-noise ratio.

9. The method of claim 8, further comprising:

acquiring a corresponding second signal-to-noise ratio based on the second surrounding scene information; and increasing the adjustment amplitude to the second amplitude and/or decreasing the adjustment speed to the second speed corresponding to the second audio signal based on the second surrounding scene information in response to the second signal-to-noise ratio being smaller than a first signal-to-noise ratio; or decreasing an adjustment amplitude to the second amplitude and/or increasing the adjustment speed to the second speed corresponding to the second audio signal based on the second surrounding scene information in response to the second signal-to-noise ratio being greater than a second signal-to-noise ratio, wherein the first signal-to-noise ratio is greater than or equal to the second signal-to-noise ratio.

10. The method of claim 8, further comprising:

acquiring a feature parameter of the second audio signal; and increasing the adjustment amplitude to the second amplitude and/or decreasing the adjustment speed to the second speed corresponding to the second audio signal based on the second surrounding scene information in response to the feature parameter being greater than a third threshold; or decreasing the adjustment amplitude to the second amplitude and/or increasing the adjustment speed to the second speed corresponding to the second audio signal based on the second surrounding scene information in response to the feature parameter being smaller than a fourth threshold, the feature parameter including one of the following:

a volume parameter of the audio signal;

a pitch parameter of the audio signal;

a mood parameter of the audio signal; or a speed parameter of the audio signal.

11. The method of claim 7, further comprising:

acquiring a feature parameter of the first audio signal; and increasing the adjustment amplitude to the first amplitude and/or decreasing the adjustment speed to the first speed corresponding to the first audio signal based on the first surrounding scene information in response to the feature parameter being greater than a third threshold; or decreasing the adjustment amplitude to the first amplitude and/or increasing the adjustment speed to the first speed corresponding to the first audio signal based on the first surrounding scene information in response to the feature parameter being smaller than a fourth threshold, the feature parameter including one of the following:

a volume parameter of the audio signal;
a pitch parameter of the audio signal;
a mood parameter of the audio signal; or
a speed parameter of the audio signal.

* * * * *